(12) United States Patent
Yang (10) Patent No.: US 11,269,031 B2
(45) Date of Patent: Mar. 8, 2022

(54) MAGNETIC RESONANCE IMAGING (MRI) RADIO FREQUENCY (RF) COIL TUNING, MATCHING, DECOUPLING, AND BALUN CIRCUIT

(71) Applicant: Quality Electrodynamics, LLC, Mayfield Village, OH (US)

(72) Inventor: Xiaoyu Yang, Indiana, PA (US)

(73) Assignee: Quality Electrodynamics, LLC, Mayfield Village, OH (US)

( * ) Notice: Subject to any disclaimer, the term of this patent is extended or adjusted under 35 U.S.C. 154(b) by 163 days.

(21) Appl. No.: 16/707,013

(22) Filed: Dec. 9, 2019

(65) Prior Publication Data

US 2020/0191889 A1 Jun. 18, 2020

Related U.S. Application Data

(60) Provisional application No. 62/778,400, filed on Dec. 12, 2018.

(51) Int. Cl.
*G01R 33/36* (2006.01)
(52) U.S. Cl.
CPC ..... *G01R 33/3657* (2013.01); *G01R 33/3628* (2013.01)
(58) Field of Classification Search
CPC ............ G01R 33/3657; G01R 33/3628; G01R 33/3685
See application file for complete search history.

(56) References Cited

U.S. PATENT DOCUMENTS

| 4,783,629 | A | * | 11/1988 | Arakawa | ............ | G01R 33/3628 |
| | | | | | | 324/318 |
| 4,825,162 | A | | 4/1989 | Roemer et al. | | |
| 6,323,648 | B1 | * | 11/2001 | Belt | .................. | G01R 33/3415 |
| | | | | | | 324/318 |
| 6,512,374 | B1 | * | 1/2003 | Misic | .................. | G01R 33/341 |
| | | | | | | 324/318 |

(Continued)

OTHER PUBLICATIONS

Menon et al., Universal Interface for MRI Local Coil, IP.com No. IPCOM000127548D, IP.com Electronic Publication Date: Aug. 31, 2005 (Year: 2005).*

*Primary Examiner* — Daniel R Miller
(74) *Attorney, Agent, or Firm* — Eschweiler & Potashnik, LLC (57) ABSTRACT

Embodiments relate to MRI coils and arrays comprising an all-in-one circuit that can perform all the functions of decoupling, balun, tuning, and preamplifier decoupling. One example embodiment is a magnetic resonance imaging (MRI) radio frequency (RF) coil element, comprising: a coil comprising at least one inductor, at least one capacitor, and two connection points; a lattice balun comprising two inputs and two outputs, wherein the two inputs of the lattice balun are connected across the two connection points of the coil; one or more shunt reactive elements connected across the two outputs of the lattice balun, wherein the one or more shunt reactive elements comprises at least one of one or more shunt capacitors or one or more shunt inductors; one or more protection diodes in parallel with the one or more shunt reactive elements; and a low input impedance preamplifier in parallel with the one or more protection diodes.

20 Claims, 5 Drawing Sheets

(56) References Cited

U.S. PATENT DOCUMENTS

| | | | | |
|---|---|---|---|---|
| 2005/0275403 | A1* | 12/2005 | Pinkerton | G01R 33/365 |
| | | | | 324/318 |
| 2012/0319687 | A1* | 12/2012 | Chu | G01R 33/365 |
| | | | | 324/318 |
| 2016/0209481 | A1* | 7/2016 | Gunamony | G01R 33/3415 |
| 2018/0203083 | A1* | 7/2018 | Sohn | G01R 33/543 |
| 2018/0275233 | A1 | 9/2018 | Yang et al. | |
| 2018/0321339 | A1 | 11/2018 | Yang et al. | |
| 2019/0154773 | A1* | 5/2019 | Stack | G01R 33/34007 |
| 2019/0154774 | A1* | 5/2019 | Hushek | G01R 33/34007 |

\* cited by examiner

MAGNETIC RESONANCE IMAGING (MRI) RADIO FREQUENCY (RF) COIL TUNING, MATCHING, DECOUPLING, AND BALUN CIRCUIT

REFERENCE TO RELATED APPLICATIONS

This application claims the benefit of U.S. Provisional Patent Application No. 62/778,400 filed Dec. 12, 2018, entitled "MAGNETIC RESONANCE IMAGING (MRI) RADIO FREQUENCY (RF) COIL TUNING, MATCHING, DECOUPLING, AND BALUN CIRCUIT", the contents of which are herein incorporated by reference in their entirety.

BACKGROUND

Magnetic resonance imaging (MRI) involves the transmission and receipt of radio frequency (RF) energy. RF energy may be transmitted by a coil. Resulting magnetic resonance (MR) signals may also be received by a coil. In early MRI, RF energy may have been transmitted from a single coil and resulting MR signals received by a single coil. Later, multiple receivers may have been used in parallel acquisition techniques. Similarly, multiple transmitters may have been used in parallel transmission (pTx) techniques.

RF coils create the $B_1$ field that rotates the net magnetization in a pulse sequence. RF coils may also detect precessing transverse magnetization. Thus, RF coils may be transmit (Tx) coils, receive (Rx) coils, or transmit and receive (Tx/Rx) coils. An imaging coil should be able to resonate at a selected Larmor frequency. Imaging coils include inductive elements and capacitive elements. The inductive elements and capacitive elements have been implemented according to existing approaches using two terminal passive components (e.g., capacitors). The resonant frequency, f, of a RF coil is determined by the inductance (L) and capacitance (C) of the inductor capacitor circuit according to equation (1):

$$f = \frac{1}{2\pi\sqrt{LC}} \quad (1)$$

Imaging coils may need to be tuned. Tuning an imaging coil may include varying the value of a capacitor. Recall that frequency: $f=\omega/(2\pi)$, wavelength in vacuum: $\lambda=c/f$, and $\lambda=4.7$ m at 1.5 T. Recall also that the Larmor frequency: $f_0=\gamma B_0/(2\pi)$, where (for $^1$H nuclei) $\gamma/(2\pi)=42.58$ MHz/T; at 1.5 T, $f_0=63.87$ MHz; at 3 T, $f_0=127.73$ MHz; at 7 T, $f_0=298.06$ MHz. Basic circuit design principles include the fact that capacitors add in parallel (impedance $1/(jC\omega)$) and inductors add in series (impedance $jL\omega$).

DETAILED DESCRIPTION

The present disclosure will now be described with reference to the attached drawing figures, wherein like reference numerals are used to refer to like elements throughout, and wherein the illustrated structures and devices are not necessarily drawn to scale.

Figure 1:
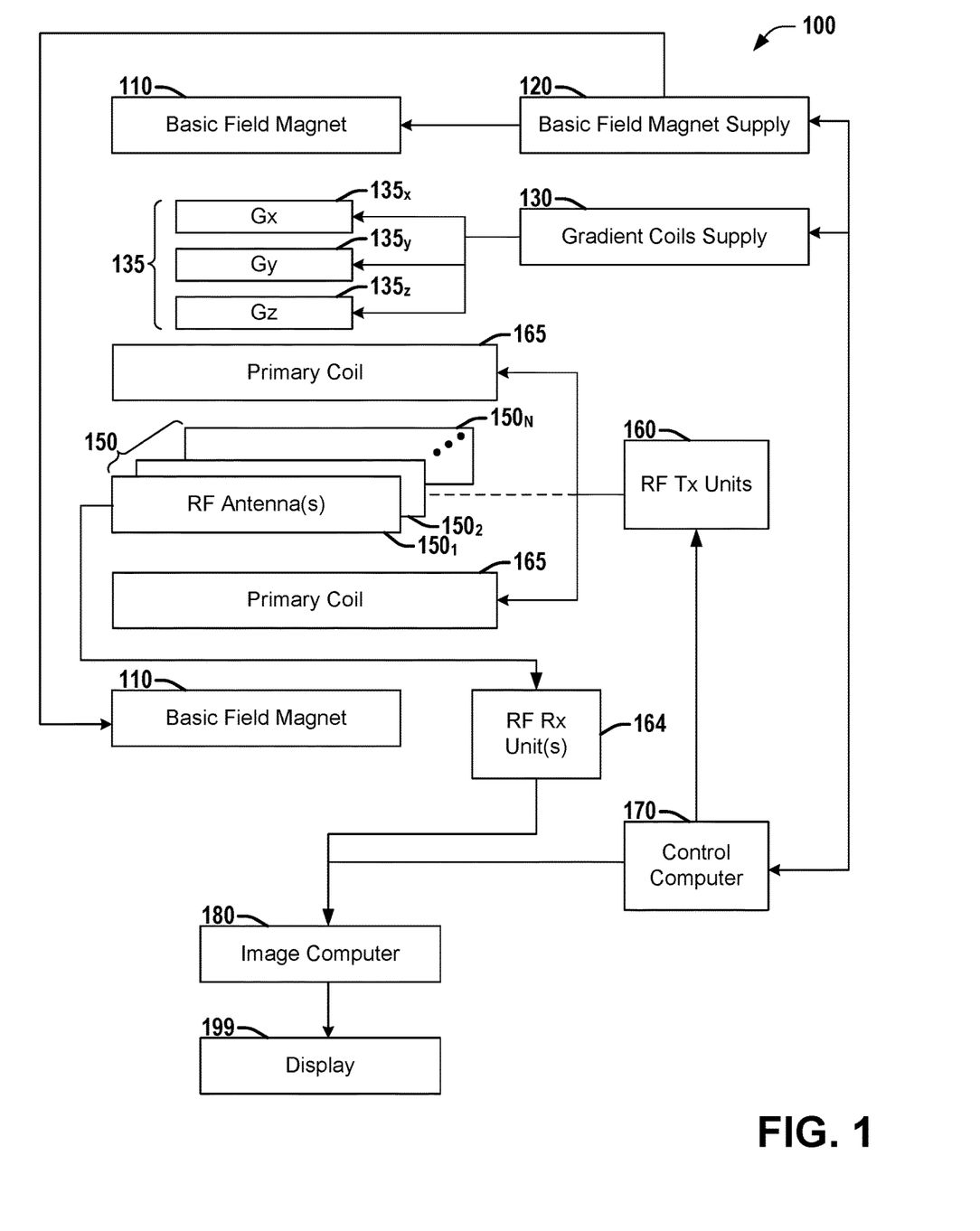
FIG. 1 is a block diagram illustrating an example MRI (Magnetic Resonance Imaging) apparatus that can be configured with example MRI RF (Radio Frequency) coils, coil elements, coil arrays, or circuitry according to one or more embodiments described herein.

Embodiments described herein can be implemented in a MRI (Magnetic Resonance Imaging) system using any suitably configured hardware and/or software. Referring to FIG. 1, illustrated is an example MRI apparatus 100 that can be configured with example MRI RF coils, coil elements, coil arrays, or circuitry according to one or more embodiments described herein. Apparatus 100 includes basic field magnet(s) 110 and a basic field magnet supply 120. Ideally, the basic field magnets 110 would produce a uniform $B_0$ field. However, in practice, the $B_0$ field may not be uniform, and may vary over an object being imaged by the MRI apparatus 100. MRI apparatus 100 can include gradient coils 135 configured to emit gradient magnetic fields like $G_x$ (e.g., via an associated gradient coil $135_x$), $G_y$ (e.g., via an associated gradient coil $135_y$) and $G_z$ (e.g., via an associated gradient coil $135_z$). The gradient coils 135 can be controlled, at least in part, by a gradient coils supply 130. In some examples, the timing, strength, and orientation of the gradient magnetic fields can be controlled, and thus selectively adapted during a MRI procedure.

MRI apparatus 100 can include a primary coil 165 configured to generate RF pulses. The primary coil 165 can be a whole body coil (WBC). The primary coil 165 can be, for example, a birdcage coil. The primary coil 165 can be controlled, at least in part, by a RF transmission unit 160. RF transmission unit 160 can provide a signal to primary coil 165.

MRI apparatus 100 can include a set of RF antennas 150 (e.g., one or more RF antennas $150_1$-$150_N$, which can be as described herein). RF antennas 150 can be configured to generate RF pulses and/or to receive resulting magnetic resonance signals from an object to which the RF pulses are directed. A RF antenna 150 configured solely to generate RF pulses can be referred to herein as a transmit (or Tx) antenna (or coil or coil array), while a RF antenna 150 configured solely to receive resulting magnetic resonance signals from an object to which the RF pulses are directed can be referred to herein as a receive (or Rx) antenna (or coil or coil array), and a RF antenna 150 configured to both generate RF pulses and receive resulting magnetic resonance signals can be referred to herein as a transmit/receive (or Tx/Rx) antenna (or coil or coil array). Unless otherwise indicated, antennas, coils, and coil arrays discussed herein can, in various embodiments, be any of a Tx antenna/coil/coil array, a Rx antenna/coil/coil array, or a Tx/Rx antenna/coil/coil array.

In some embodiments, RF antennas 150 can be configured to inductively couple with primary coil 165 and generate RF pulses and to receive resulting magnetic resonance signals from an object to which the RF pulses are directed. In other embodiments, RF antennas 150 can be electrically coupled to a power source (e.g., RF Tx unit 160) that can drive RF antennas 150 to generate RF pulses, and RF antennas can also be configured to receive resulting magnetic resonance signals from an object to which the RF pulses are directed. In one embodiment, one or more members of the set of RF antennas 150 can be fabricated from flexible coaxial cable, or other conductive material. The set of RF antennas 150 can be connected with a RF receive unit 164.

The gradient coils supply 130 and the RF transmission units 160 can be controlled, at least in part, by a control computer 170. The magnetic resonance signals received from the set of RF antennas 150 can be employed to generate an image, and thus can be subject to a transformation process like a two dimensional fast Fourier transform (FFT) that generates pixilated image data. The transformation can be performed by an image computer 180 or other similar processing device. The image data can then be shown on a display 199. RF Rx Units 164 can be connected with control computer 170 or image computer 180. While FIG. 1 illustrates an example MRI apparatus 100 that includes various components connected in various ways, it is to be appreciated that other MRI apparatus can include other components connected in other ways, and can be employed in connection with various embodiments discussed herein.

In one embodiment, MRI apparatus 100 includes control computer 170. In one example, a member of the set of RF antennas 150 can be individually controllable by the control computer 170. A member of the set of RF antennas 150 can be an example MRI RF coil array including, for example, MRI RF coil arrays as described herein. In various embodiments, the set of RF antennas 150 can include various combinations of example embodiments of MRI RF coil arrays, elements or example embodiments of MRF RF coil arrays, including single-layer MRI RF coil elements or single-layer MRI RF coil arrays, according to various embodiments described herein.

A MRI apparatus can include, among other components, a controller (e.g., control computer 170) and a RF coil (e.g., primary coil 165) operably connected to the controller. The controller can provide the RF coil with a current, a voltage, or a control signal. The coil can be a whole body coil. The coil can inductively couple with an example MRI RF coil element, or MRI RF coil array, as described herein. Control computer 170 can provide a DC bias current, or control a DC bias control circuit to control the application of a DC bias current to MRI RF coil arrays or elements that can be part of antennas 150.

Figure 2:
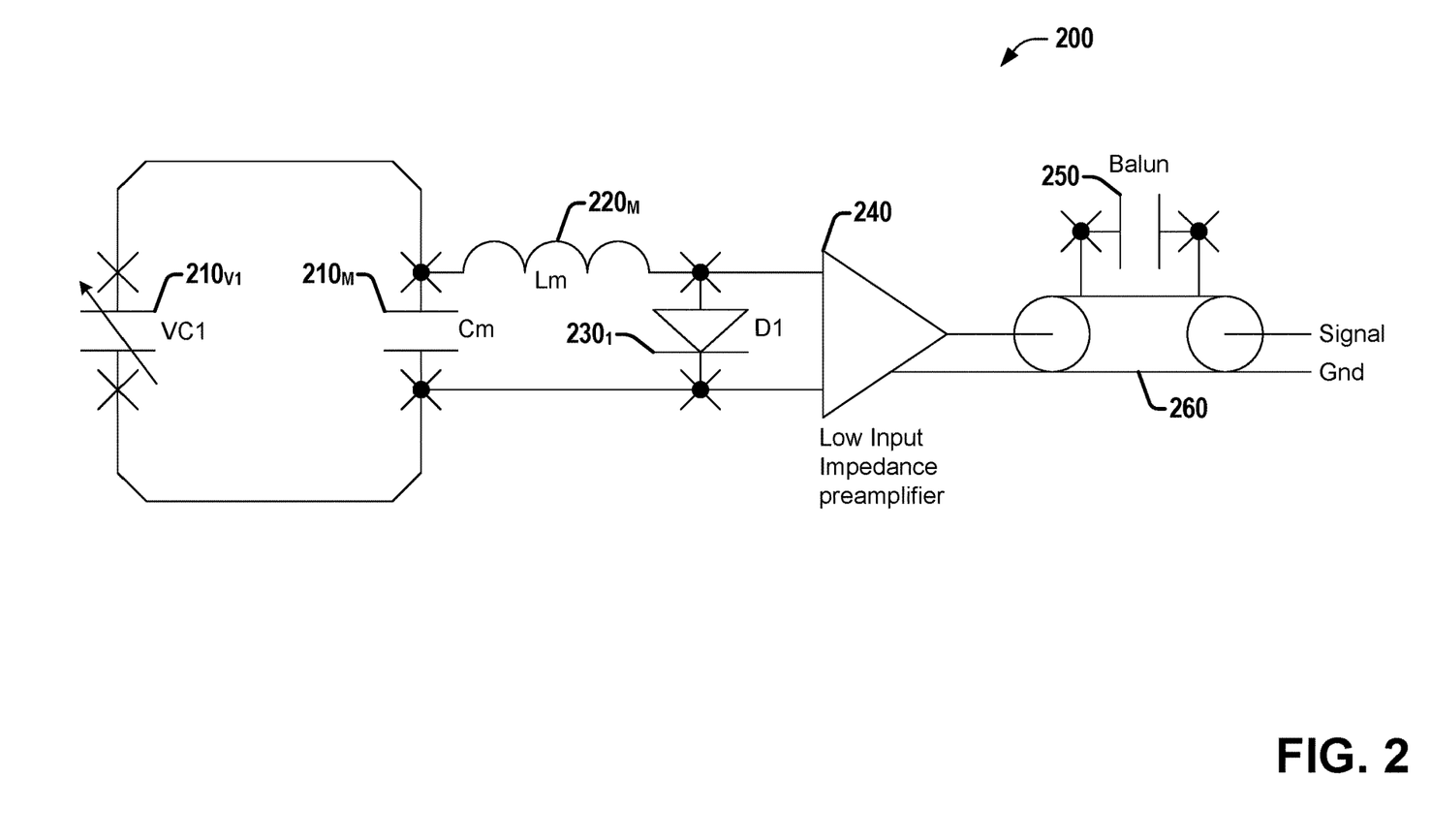
FIG. 2 is a diagram illustrating an example receiving element that can be employed in a receiver array coil, in connection with various aspects discussed herein.

Receiver array coils have been employed in a variety of coils in the receiving (Rx) mode. Referring to FIG. 2, illustrated is a diagram of the setup of an example receiving element 200 that can be employed in a receiver array coil, in connection with various aspects discussed herein. In FIG. 2, tuning, matching, decoupling, preamplification, and common mode mitigation (e.g., via a balun) are performed via separate components. Variable capacitor $210_{V1}$ (e.g., with value VC1) is for coil frequency tuning. Capacitor $210_M$ (e.g., with value Cm) is employed as a matching capacitor. Inductor $220_M$ (e.g., with value Lm) is a matching inductor. Diode $230_1$ (D1) is a decoupling diode which can be a PIN diode or a pair of cross protection diodes. Diode $230_1$ creates a high impedance decoupling across capacitor $210_M$ (Cm) in a transmitting (Tx) mode, because capacitor $210_M$ (Cm) and inductor $220_M$ (Lm) resonate at the working frequency. Preamplifier 240 is a low impedance amplifier which creates a high impedance across capacitor $210_M$ (Cm) in receiving (Rx) mode for decoupling of preamplifier 240. Balun 250 that can be either before preamplifier 240 or after preamplifier 240. Balun 250 mitigates common mode current on the cable shield of coaxial cable 260, which improves SNR (Signal-to-Noise Ratio) in Rx mode and reduces heating in Tx mode.

Figure 3:
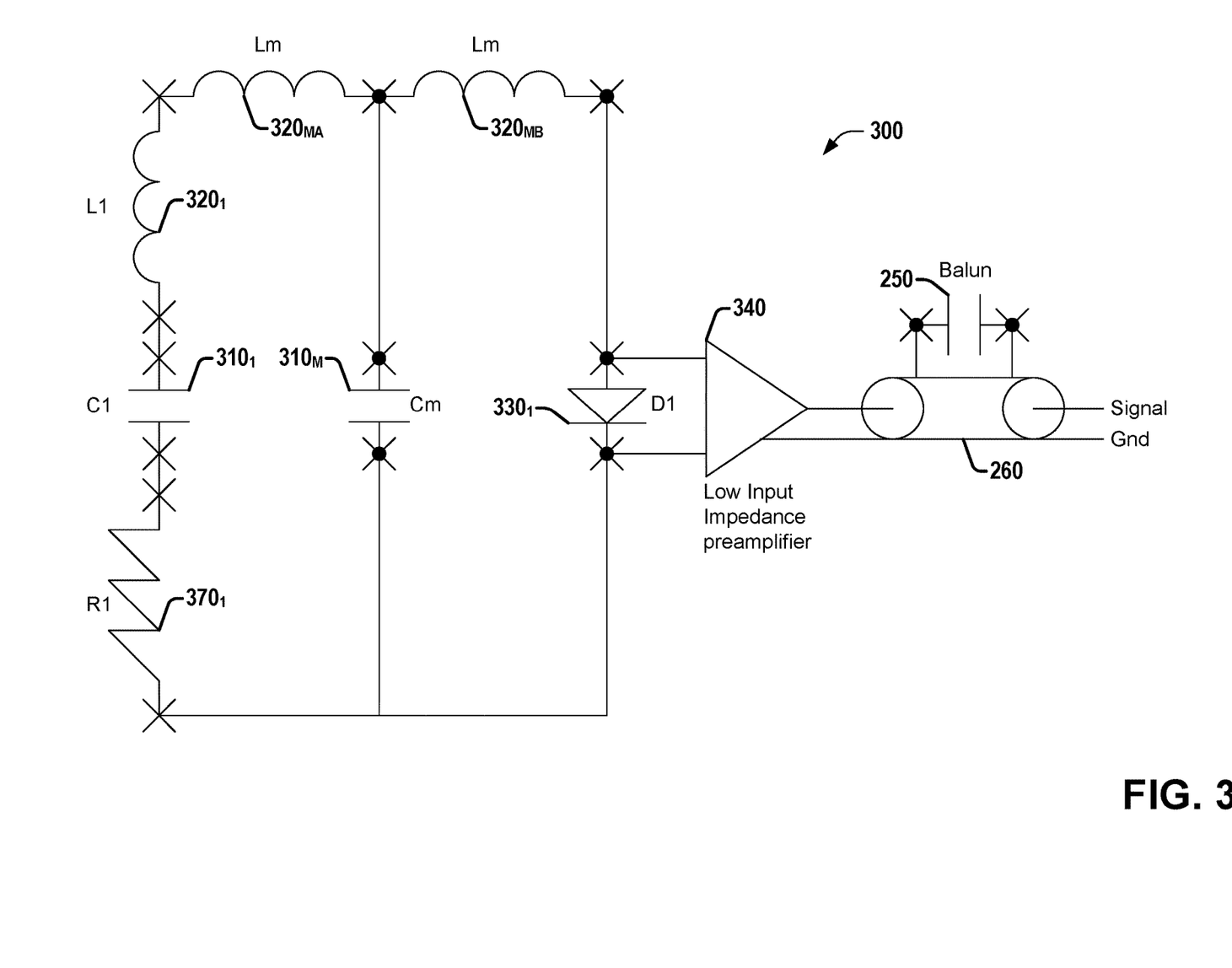
FIG. 3 is a diagram illustrating the equivalent circuit diagram of the receiving element of FIG. 2, in connection with various aspects discussed herein.

Referring to FIG. 3, illustrated is the equivalent circuit diagram 300 of the receiving element of FIG. 2, in connection with various aspects discussed herein. Capacitor $310_1$ (e.g., with value C1) is the equivalent capacitor, which includes all coil breakpoint capacitors. Inductor $320_1$ (e.g., with value L1) is the part of the coil trace inductor that resonates with capacitor $310_1$ (C1). At the working frequency, the impedances of capacitor $310_1$ (C1) and inductor $320_1$ (L1) cancel each other due to the resonance. Resistor $370_1$ (e.g., with value R1) is the coil loss, which can include coil trace loss, scanning subject loss, and coil radiation loss. Inductor $320_{MA}$ (e.g., with value Lm) is the part of the coil trace inductance used for matching purpose. Capacitor $310_M$ (Cm) is the matching capacitor and inductor $320_{MB}$ (e.g., with value Lm) is the matching inductor. The impedance of the two inductors $320_{MA}$ and $320_{MB}$ (Lm) and capacitor $310_M$ (Cm) are the same at the working frequency, and create a lumped element quarter wave transformer that converts resistor $370_1$ (R1) to a target impedance expected for input to preamplifier 340 (e.g., 50 Ohm). Assume that target impedance is 50 Ohm, then, per equation (2):

$$R1*50=|Zm|^2 \quad (2),$$

where $|Zm|=\omega_0 Lm$ or $1/(\omega_0 Cm)$ and $\omega_0$ is the working frequency. In this manner, matching of coil elements (e.g., element 200) can be realized in existing array coils. For such a coil to work, each coil element (e.g., 200, etc.) also needs decoupling, balun, tuning, and preamplifier decoupling. All of these functions can be located in different parts of the coil. One of the parts (balun, e.g., balun 250) of existing coil elements requires use of a wound coax cable (e.g., cable 260) or tri-axial structure to build. Adding these together can be expensive if the number of channels becomes large (e.g., 64, etc.).

In contrast to existing techniques, coil elements and coils according to various embodiments discussed herein can employ an all-in-one circuit that can be localized in one part of the circuit that can perform all the functions of decoupling, balun, tuning, and preamplifier decoupling. Embodiments employing such an all-in-one circuit have a reduced cost when compared with existing coils.

Figure 4:
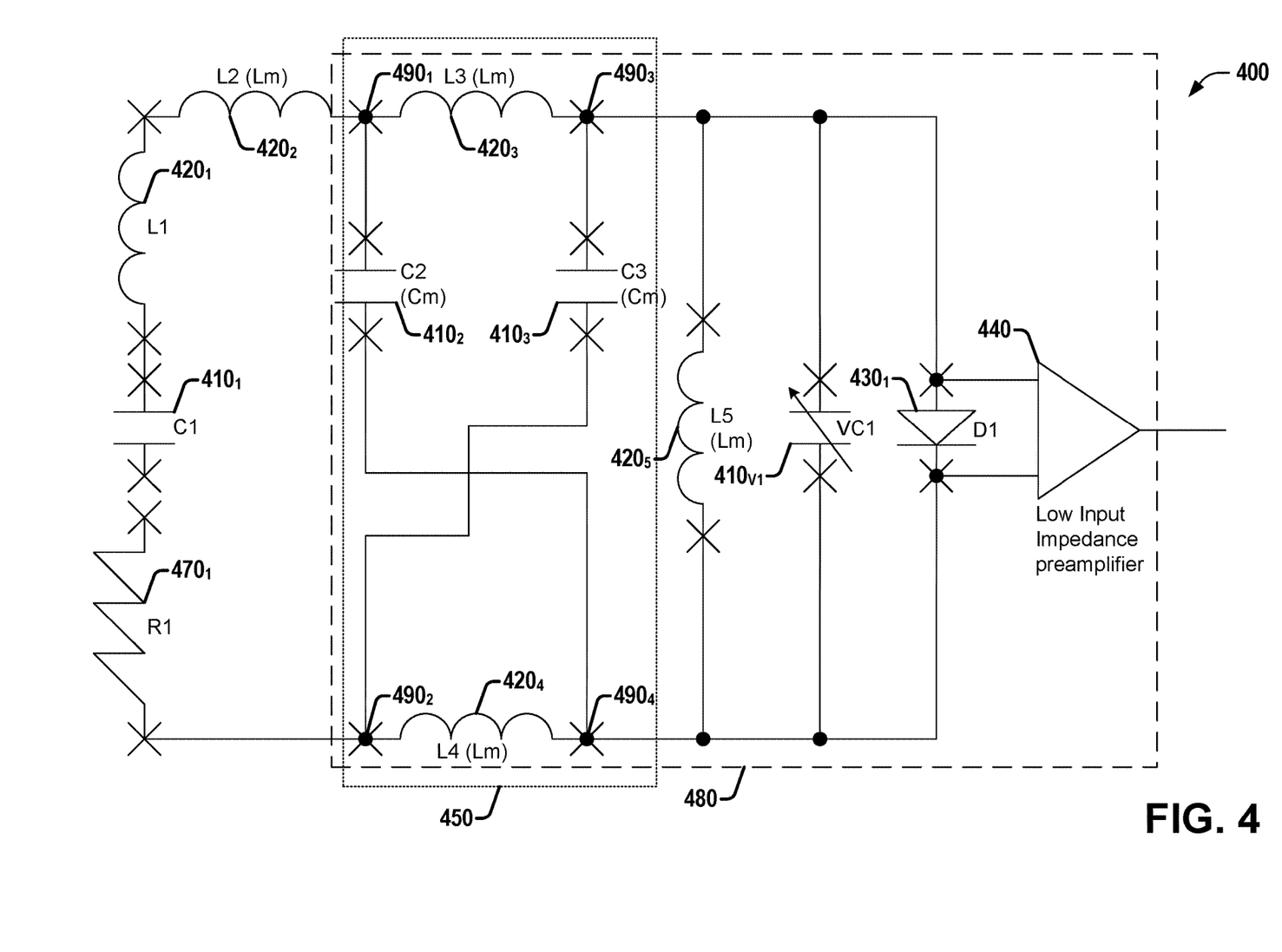
FIG. 4 is a diagram illustrating an example embodiment of a coil element employing an example all-in-one circuit that facilitates matching, the capabilities of a balun (e.g., common mode mitigation, etc.), tuning, decoupling, and preamplifier decoupling, according to various embodiments discussed herein.

Referring to FIG. 4, illustrated is a diagram of an example embodiment of a coil element 400 employing an example all-in-one circuit 480 that facilitates matching, the capabilities of a balun (e.g., common mode mitigation, etc.), tuning, decoupling, and preamplifier decoupling, according to various embodiments discussed herein. In various embodiments, coil element 400 can be employed as a RF antenna 150 in a MRI apparatus 100, or other MRI apparatus.

In various aspects, embodiments such as coil element 400 can employ a lattice balun, such as example lattice balun 450, across two connection points (e.g., nodes $490_1$ and $490_2$) of the coil (e.g., comprising capacitor $410_1$, inductors $420_1$, $420_2$, and resistor $470_1$) of coil element 400. Lattice balun 450 comprises inductor $420_3$ (L3, which can have value Lm), inductor $420_4$ (L4, which can have value Lm), capacitor $410_2$ (C2, which can have the value Cm) and capacitor $410_3$ (C3, which can have the value Cm). The magnitude of the impedance of each of $410_2$, $410_3$, $420_3$, and $420_4$ equals the magnitude of Lm (Zm) at the working frequency. In various embodiments, elements $410_2$, $410_3$, $420_3$, and $420_4$ can be arranged in lattice balun 450 as illustrated in FIG. 4, with capacitor $410_2$ arranged between nodes $490_1$ and $490_4$, capacitor $410_3$ arranged between nodes $490_2$ and $490_3$, inductor $420_3$ arranged between nodes $490_1$ and $490_3$, and inductor $420_4$ arranged between nodes $490_2$ and $490_4$. Coil element 400 also comprises inductor $420_5$ (L5, which can have the value Lm) across the output of the lattice balun 450 (e.g., between nodes $490_3$ and $490_4$) as a shunt reactive element (various other embodiments can employ a capacitor instead).

The matching technique employed by coil element 400 can be explained by analyzing the impedance from the left to the right. At the input of the lattice balun 450 (across nodes $490_1$ and $490_2$, e.g., across the coil (comprising capacitor $410_1$, inductors $420_1$ and $420_2$, and resistor $470_1$) of coil element 400), the balun 450 will see Rc+jZm, with inductor $420_1$ (L1) and capacitor $410_1$ (C1) canceling each other at the working frequency due to resonance (with resistor $470_1$ representing the coil loss, similar to $370_1$ in FIG. 3). Since the impedance of lattice balun 450 is Zm and considered as a quarter-wave length transmission transformer, it will convert the input impedance per equation (3):

$$\frac{Zm^2}{Rc + jZm} = \frac{Zm^2}{Rc^2 + Zm^2}(Rc - jZm) \qquad (3)$$

After lattice balun 450, the impedance becomes a capacitive load, with Q of Zm/Rc. If an inductor with impedance $$\frac{Zm^2}{Rc^2 + Zm^2}(jZm)(\sim Zm \text{ if } Q \text{ is large})$$

is put in parallel with this capacitive load (e.g., inductor $420_5$), the impedance across the lattice output (across nodes $490_3$ and $490_4$) is given by equation (4):

$$(Q^2 + 1)\frac{Zm^2}{Rc^2 + Zm^2}Rc = \frac{Zm^2}{Rc} = 50 \qquad (4)$$

As can be seen from a comparison between equations (2) and (4), the matching technique employed in coil element 400 is theoretically equivalent to the existing matching technique employed in coil element 200. However, one difference between the matching technique discussed herein and existing array coil matching is that embodiments discussed herein (e.g., coil element 400) can omit a matching capacitor (e.g., capacitor $210_M$ in coil element 200) before lattice balun 450, and the matching function in coil element 400 can be realized by the matching inductor $420_5$ at the output of the lattice balun 450 (e.g., between nodes $490_3$ and $490_4$). For similar embodiments to existing array coils wherein the matching element is an inductor instead of a capacitor (e.g., instead of capacitor $210_M$), then the matching element at the output (e.g., between nodes $490_3$ and $490_4$) of the lattice balun 450 can be a capacitor (e.g., instead of inductor $420_5$). Additionally, coil element 400 can comprise a small variable capacitor $410_{V1}$ (VC1) as a tuning capacitor (e.g., across nodes $490_3$ and $490_4$). Adjusting capacitor $410_{V1}$ can change the resonant frequency of the coil. In other embodiments, a variable inductor (not shown) can replace inductor $420_5$ (L5), and adjusting the value of the variable inductor can tune the coil frequency. In still other embodiments, a variable capacitor (e.g., capacitor $410_{V1}$) can be placed in series with inductor $420_5$ for coil tuning, instead of in parallel with inductor $420_5$ between nodes $490_3$ and $490_4$. Coil element 400 can also comprise, in parallel between nodes $490_3$ and $490_4$, diode $430_1$ (D1) (which can be arranged in either orientation) and the low input impedance of preamplifier 440 (e.g., which can be a low noise amplifier, etc.), which can add the functions of decoupling and preamplifier decoupling. Thus, circuit 480 of coil element 400 can provide the functions of balun, matching, tuning, decoupling and preamplifier decoupling.

Circuit 480 of coil element 400 provides several advantages over existing techniques (e.g., those shown in FIG. 2, etc.). First, because all controlling components are in the same area, the tuning process is easier. Second, all of the components of 480 except preamplifier 440 are lumped elements which can be selected and placed for PCB (printed circuit board) assembly automation. Third, circuit 480 provides for reduced size of coil element 400 compared to existing coil elements. The balun (e.g., balun 250) in existing coil elements is large compared to the lumped elements of circuit 480. In various embodiments, the same matching technique can be employed in coils employing Single Layer Technology (SLT), wherein a single coil element and/or array is configured to operate alternately in both a Tx mode and an Rx mode. SLT coils and coil arrays are discussed in co-owned application Ser. Nos. 15/933,860 and 15/971,075, the entireties of which are incorporated herein by reference.

Figure 5:
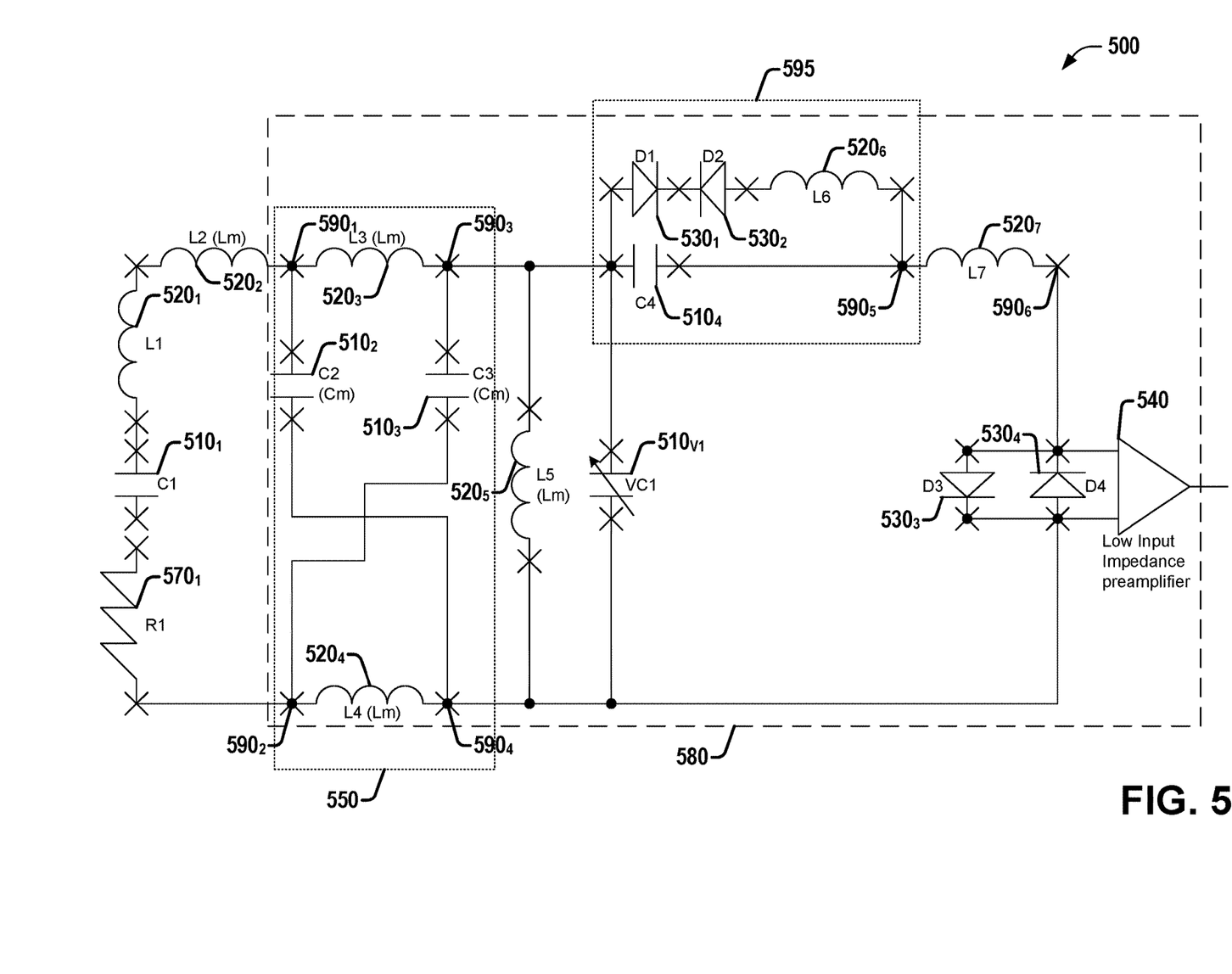
FIG. 5 is a diagram illustrating an example Single Layer Technology coil element configured to operate in a Tx mode and in a Rx mode that employs an all-in-one balun, matching, tuning, and preamplifier decoupling circuit, according to various embodiments discussed herein.

Referring to FIG. 5, illustrated is a diagram of an example SLT coil element 500 configured to operate in a Tx mode and in a Rx mode that employs an all-in-one balun, matching, tuning, and preamplifier decoupling circuit 550, according to various embodiments discussed herein. In various embodiments, coil element 500 can be employed as a RF antenna 150 in a MRI apparatus 100, or other MRI apparatus. In coil element 500, capacitors $510_1$-$510_3$ and $510_{V1}$ can be similar and similarly arranged to capacitors $410_1$-$410_3$ and $410_{V1}$ of coil element 400, inductors $520_1$-$520_5$ can be similar and similarly arranged to inductors $420_1$-$420_5$ of coil element 400, lattice balun 550 can be similar and similarly arranged to lattice balun 450 of coil element 400, resistor $570_1$ can be similar and similarly arranged to resistor $470_1$ of coil element 400, and nodes $590_1$-$590_4$ can be similar and similarly arranged to nodes $490_1$-$490_4$ of coil element 400.

Coil element 500 can also comprise capacitor $510_4$ (e.g., which can have value C4) between nodes $590_3$ and $590_5$, in parallel with PIN diodes $530_1$ (D1) and $530_2$ (D2) (which can be arranged back to back) and inductor $520_6$ (e.g., which can have value L6) connected in series with one another (e.g., with node $590_3$ connected to the anode of diode $530_1$, the cathode of diode $530_1$ connected to the cathode of diode $530_2$, the anode of diode $530_2$ connected to one end of inductor $520_6$, and the other end of inductor $520_6$ connected to node $590_5$). Additionally, coil element 500 can comprise inductor $520_7$ (e.g., which can have value L7) arranged between nodes $590_5$ and $590_6$. In coil element 500, preamplifier 540 (which can be similar to preamplifier 440) can be arranged between nodes $590_4$ and $590_6$, in parallel with diode $530_3$ and with diode $530_4$ (each of which can also be connected between nodes $590_4$ and $590_6$, but with opposing polarities).

In the Tx mode of SLT coil element 500, a Tx mode circuit 595 comprising diodes $530_1$ (D1) and $530_2$ (D2) can be ON (e.g., short), inductor $520_6$ (L6) and capacitor $510_4$ (C4) resonate with each other at the working frequency, and there is high impedance across capacitor $510_4$ (C4) which isolates preamplifier 540 from the matching circuit 550. Therefore, in the Tx mode, the coil inductor $520_1$ (L1) and capacitor $510_1$ (C1) see low impedance by looking at the circuit 580 from the left, thus, SLT coil element 500 is resonating in Tx mode. In various embodiments, other Tx mode circuits can employ different reactive elements (e.g., an inductor in place of capacitor $510_4$ and a capacitor in place of inductor $520_6$).

In Rx mode or an unplugged situation of SLT coil element 500, diode $530_1$ (D1) and diode $530_2$ (D2) are considered open and inductor $520_7$ (L7) and capacitor $510_4$ (C4) resonate in series at the working frequency, thus the impedance of inductor $520_7$ (or corresponding capacitor in embodiments wherein capacitor $510_4$ is replaced by an inductor, etc.) cancels the impedance of the Tx mode circuit, which is just that of capacitor $510_4$ when diode $530_1$ (D1) and diode $530_2$ (D2) are considered open. Thus, in the Rx mode, the lattice balun 550 sees the low impedance of the preamplifier 540 to realize preamplifier decoupling. If the RF power is large in the Tx mode/unplugged situation, the crossed diodes $530_3$ (D3) and $530_4$ (D4) will become ON to protect preamplifier 540, while $530_1$(D1) and diode $530_2$ (D2) can be kept OFF due to their opposing polarities without bias.

In various embodiments, the resonant frequency in the Tx mode can differ from the resonating frequency in the Rx mode for SLT technology, although for ease of illustration, circuitry that can facilitate this variation in resonant frequency is omitted in FIG. 5. Additionally, although coil element 500 is an example of a coil element that can operate as a Tx coil via inductive coupling, in other embodiments, a similar coil element (capable of operating alternately in the Tx mode and the Rx mode) can be employed that operates in the Tx mode via a direct (e.g., wired) connection to a Tx signal.

Additionally, although example coil elements 400 and 500 are provided as illustrative examples of coil elements employing an all-in-one circuit (e.g., circuit 450 or circuit 550, etc.) to facilitate tuning, matching, decoupling, preamplification, and common mode mitigation (e.g., via a balun), any of a variety of other embodiments can be employed (e.g., as a RF antenna 150 in a MRI apparatus 100 or other MRI apparatus), according to various aspects discussed herein. For example, although coil elements 400 and 500 illustrate certain elements as directly connected, in some other embodiments, one or more additional intervening elements can be included such that those certain elements remain connected, but are no longer directly connected.

Examples herein can include subject matter such as a method, means for performing acts or blocks of the method, at least one machine-readable medium including executable instructions that, when performed by a machine (e.g., MRI machine, for example as described herein, etc.) cause the machine to perform acts of the method or of an apparatus or system according to embodiments and examples described.

A first example embodiment comprises an element channel of a magnetic resonance imaging (MRI) radio frequency (RF) array coil, comprising: inductors (e.g., $420_1$ and $420_2$, $520_1$ and $520_2$, etc.) and breaking point capacitors (e.g., $410_1$, $510_1$, etc.) as a coil with two connecting points (e.g., $490_1$ and $490_2$, $590_1$ and $590_2$, etc.), a lattice balun (e.g., 450, 550, etc.) which connects at its input to the coil, a capacitor (e.g., $410_{V1}$, $510_{V1}$, etc.) and/or an inductor (e.g., $420_5$, $520_5$, etc.) that shunts the output of the lattice balun for matching, protection diodes (e.g., $430_1$, $530_1$, etc.) in parallel with the shunt capacitor or inductor above, and the low input impedance preamplifier (e.g., 450, 550, etc.) in parallel with protection diodes.

A second example embodiment comprises the first example embodiment, wherein the shunt inductor and/or capacitor can be variable for coil tuning.

A second example embodiment comprises the first example embodiment, wherein the protection diodes can comprise one or more of PIN diodes for active control or cross diodes for passive control.

A fourth example embodiment comprises an element channel of a magnetic resonance imaging (MRI) radio frequency (RF) SLT coil comprising: inductors (e.g., $520_1$ and $520_2$, etc.) and breaking point capacitors (e.g., $510_1$, etc.) as a coil with two connecting points (e.g., $590_1$ and $590_2$, etc.), a lattice balun (e.g., 550, etc.) which connects at its input to the coil, a capacitor (e.g., $510_{V1}$, etc.) and/or an inductor (e.g., $520_5$, etc.) that shunts the output of the lattice balun for matching, a pair of back to back high voltage PIN diode (e.g., $530_1$, $530_2$, etc.) with capacitor $510_4$ and inductor $520_6$ to create high impedance in Tx to isolate preamplifier (e.g., 540, etc.) and coil/balun/shunt, a capacitor or inductor (e.g., $520_7$, etc.) to cancel reactance of back to back PIN diode circuit in Rx mode, and the low input impedance preamplifier (e.g., 540, etc.) in parallel with protection diodes (e.g., $530_3$, $530_4$, etc.).

A fifth example embodiment comprises the fourth example embodiment, wherein the shunt inductor or capacitor can be variable for coil tuning.

A sixth example embodiment comprises the fourth example embodiment, wherein the protection diodes can comprise one or more of a PIN diode for active control or cross diodes for passive control.

The following examples are additional embodiments.

Example 1 is a magnetic resonance imaging (MRI) radio frequency (RF) coil element configured to operate in at least one of a transmit (Tx) mode or a receive (Rx) mode, the MRI RF coil array comprising: a coil comprising at least one inductor, at least one capacitor, and two connection points; a lattice balun comprising two inputs and two outputs, wherein the two inputs of the lattice balun are connected across the two connection points of the coil; one or more shunt reactive elements connected across the two outputs of the lattice balun, wherein the one or more shunt reactive elements comprises at least one of one or more shunt capacitors or one or more shunt inductors; one or more protection diodes in parallel with the one or more shunt reactive elements; and a low input impedance preamplifier in parallel with the one or more protection diodes.

Example 2 comprises the subject matter of any variation of any of example(s) 1, wherein the one or more shunt reactive elements comprises at least one variable shunt reactive element that facilitates tuning of the coil.

Example 3 comprises the subject matter of any variation of any of example(s) 1-2, wherein the one or more protection diodes comprise at least one PIN diode that facilitates active decoupling.

Example 4 comprises the subject matter of any variation of any of example(s) 1-3, wherein the one or more protection diodes comprise at least one pair of crossed diodes that facilitates passive decoupling.

Example 5 comprises the subject matter of any variation of any of example(s) 1-4, wherein the low input impedance preamplifier is a low noise amplifier.

Example 6 comprises the subject matter of any variation of any of example(s) 1-5, wherein the lattice balun comprises a first lattice balun capacitor, a second lattice balun capacitor, a first lattice balun inductor, and a second lattice balun inductor.

Example 7 comprises the subject matter of any variation of any of example(s) 6, wherein the two inputs of the lattice balun comprise a first input and a second input, wherein the two outputs of the lattice balun comprise a first output and a second output, wherein the first lattice balun capacitor is connected between the first input and the second output, wherein the second lattice balun capacitor is connected between the second input and the first output, wherein the first lattice balun inductor is connected between the first input and the first output, and wherein the second lattice balun inductor is connected between the second input and the second output.

Example 8 comprises the subject matter of any variation of any of example(s) 1-7, further comprising a printed circuit board (PCB) that comprises the lattice balun, the one or more shunt reactive elements, and the one or more protection diodes.

Example 9 is a MRI RF coil array comprising a plurality of MRI RF coil elements according to any variation of any of example(s) 1-8.

Example 10 is a magnetic resonance imaging (MRI) radio frequency (RF) coil element configured to operate in at least one of a transmit (Tx) mode or a receive (Rx) mode, the MRI RF coil array comprising: a coil comprising at least one inductor, at least one capacitor, and two connection points; a lattice balun comprising two inputs and two outputs, wherein the two inputs of the lattice balun are connected across the two connection points of the coil; one or more shunt reactive elements connected across the two outputs of the lattice balun, wherein the one or more shunt reactive elements comprises at least one of one or more shunt capacitors or one or more shunt inductors; one or more protection diodes in parallel with the one or more shunt reactive elements; a low input impedance preamplifier in parallel with the one or more protection diodes; a Tx mode circuit comprising two PIN diodes arranged back to back and at least one of one or more Tx mode inductors or one or more Tx mode capacitors, wherein in the Tx mode, the at least one of the one or more Tx mode inductors or the one or more Tx mode capacitors is configured to create a high impedance that isolates the preamplifier from the coil, the lattice balun, and the one or more shunt reactive elements; and at least one Rx mode inductor or at least one Rx mode capacitor, wherein in the Rx mode, the at least one Rx mode inductor or the at least one Rx mode capacitor is configured to cancel a reactance of the Tx mode circuit.

Example 11 comprises the subject matter of any variation of any of example(s) 10, wherein the one or more shunt reactive elements comprises at least one variable shunt reactive element that facilitates tuning of the coil.

Example 12 comprises the subject matter of any variation of any of example(s) 10-11, wherein the one or more protection diodes comprise at least one PIN diode that facilitates active decoupling.

Example 13 comprises the subject matter of any variation of any of example(s) 10-12, wherein the one or more protection diodes comprise at least one pair of crossed diodes that facilitates passive decoupling.

Example 14 comprises the subject matter of any variation of any of example(s) 10-13, wherein the low input impedance preamplifier is a low noise amplifier.

Example 15 comprises the subject matter of any variation of any of example(s) 10-14, wherein the lattice balun comprises a first lattice balun capacitor, a second lattice balun capacitor, a first lattice balun inductor, and a second lattice balun inductor.

Example 16 comprises the subject matter of any variation of any of example(s) 15, wherein the two inputs of the lattice balun comprise a first input and a second input, wherein the two outputs of the lattice balun comprise a first output and a second output, wherein the first lattice balun capacitor is connected between the first input and the second output, wherein the second lattice balun capacitor is connected between the second input and the first output, wherein the first lattice balun inductor is connected between the first input and the first output, and wherein the second lattice balun inductor is connected between the second input and the second output.

Example 17 comprises the subject matter of any variation of any of example(s) 10-16, further comprising a printed circuit board (PCB) that comprises the lattice balun, the one or more shunt reactive elements, the one or more protection diodes, the Tx mode circuit, and the at least one Rx mode inductor or the at least one Rx mode capacitor.

Example 18 is a MRI RF coil array comprising a plurality of MRI RF coil elements according to any variation of any of example(s) 10-17.

Example 19 is a magnetic resonance imaging (MRI) radio frequency (RF) coil array configured to operate in at least one of a transmit (Tx) mode or a receive (Rx) mode, the MRI RF coil array comprising: a plurality of coil elements, wherein each coil element of the plurality of coil elements comprises: a coil of that coil element comprising at least one inductor of that coil, at least one capacitor of that coil, and two connection points of that coil; a lattice balun of that coil element comprising two inputs of that lattice balun and two outputs of that lattice balun, wherein the two inputs of that lattice balun are connected across the two connection points of the coil of that coil element; one or more shunt reactive elements of that coil element connected across the two outputs of the lattice balun of that coil element, wherein the one or more shunt reactive elements comprises at least one of one or more shunt capacitors of that coil element or one or more shunt inductors of that coil element; one or more protection diodes of that coil element in parallel with the one or more shunt reactive elements of that coil element; and a low input impedance preamplifier of that coil element in parallel with the one or more protection diodes of that coil element.

Example 20 comprises the subject matter of any variation of any of example(s) 19, wherein each coil element of the plurality of coil elements comprises: a Tx mode circuit of that coil element comprising two PIN diodes of that coil element arranged back to back and at least one of one or more Tx mode inductors of that coil element or one or more Tx mode capacitors of that coil element, wherein in the Tx mode, the at least one of the one or more Tx mode inductors of that coil element or the one or more Tx mode capacitors of that coil element is configured to create a high impedance that isolates the preamplifier of that coil element from the coil of that coil element, the lattice balun of that coil element, and the one or more shunt reactive elements of that coil element; and at least one Rx mode inductor of that coil element or at least one Rx mode capacitor of that coil element, wherein in the Rx mode, the at least one Rx mode inductor of that coil element or the at least one Rx mode capacitor of that coil element is configured to cancel a reactance of the Tx mode circuit of that coil element.

Example 21 is a MRI apparatus comprising a MRI RF coil according to any variation of any of example(s) 1-20.

Circuits, apparatus, elements, MRI RF coils, arrays, methods, and other embodiments described herein are described with reference to the drawings in which like reference numerals are used to refer to like elements throughout, and where the illustrated structures are not necessarily drawn to scale. Embodiments are to cover all modifications, equivalents, and alternatives falling within the scope of the disclosure and appended claims. In the figures, the thicknesses of lines, layers and/or regions may be exaggerated for clarity. Nothing in this detailed description (or drawings included herewith) is admitted as prior art.

Like numbers refer to like or similar elements throughout the description of the figures. When an element is referred to as being "connected" to another element, it can be directly connected to the other element or intervening elements may be present. In contrast, when an element is referred to as being "directly connected" to another element, there are no intervening elements present. Other words used to describe the relationship between elements should be interpreted in a like fashion (e.g., "between" versus "directly between," "adjacent" versus "directly adjacent," etc.).

In the above description some components may be displayed in multiple figures carrying the same reference signs, but may not be described multiple times in detail. A detailed description of a component may then apply to that component for all its occurrences.

The following includes definitions of selected terms employed herein. The definitions include various examples or forms of components that fall within the scope of a term and that may be used for implementation. The examples are not intended to be limiting. Both singular and plural forms of terms may be within the definitions.

References to "one embodiment", "an embodiment", "various embodiments," "one example", "an example", or "various examples" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrases "in one embodiment" or "in various embodiments" does not necessarily refer to the same embodiment(s), though it may.

"Circuit", as used herein, includes but is not limited to hardware, firmware, or combinations of each to perform a function(s) or an action(s), or to cause a function or action from another circuit, logic, method, or system. Circuit can include a software controlled microprocessor, a discrete logic (e.g., ASIC), an analog circuit, a digital circuit, a programmed logic device, a memory device containing instructions, and other physical devices. A circuit can include one or more gates, combinations of gates, or other circuit components. Where multiple logical circuits are described, it may be possible to incorporate the multiple logical circuits into one physical circuit. Similarly, where a single logical circuit is described, it may be possible to distribute that single logical logic between multiple physical circuits.

"Computer-readable storage device", as used herein, refers to a device that stores instructions or data. "Computer-readable storage device" does not refer to propagated signals. A computer-readable storage device can take forms, including, but not limited to, non-volatile media, and volatile media. Non-volatile media can include, for example, optical disks, magnetic disks, tapes, and other media. Volatile media can include, for example, semiconductor memories, dynamic memory, and other media. Common forms of a computer-readable storage device can include, but are not limited to, a floppy disk, a flexible disk, a hard disk, a magnetic tape, other magnetic medium, an application specific integrated circuit (ASIC), a compact disk (CD), other optical medium, a random access memory (RAM), a read only memory (ROM), a memory chip or card, a memory stick, and other media from which a computer, a processor or other electronic device can read.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". The term "and/or" is used in the same manner, meaning "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store can store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations. In addition, while a particular feature may have been disclosed with respect to only one of several implementations, such feature can be combined with one or more other features of the other implementations as may be desired and advantageous for any given or particular application.

What is claimed is:

1. A magnetic resonance imaging (MRI) radio frequency (RF) coil element configured to operate in at least one of a transmit (Tx) mode or a receive (Rx) mode, the MRI RF coil element comprising:
   a coil comprising at least one inductor, at least one capacitor, and two connection points;
   a lattice balun comprising two inputs and two outputs, wherein the two inputs of the lattice balun are connected across the two connection points of the coil;
   one or more shunt reactive elements connected across the two outputs of the lattice balun, wherein the one or more shunt reactive elements comprises at least one of one or more shunt capacitors or one or more shunt inductors;
   one or more protection diodes in parallel with the one or more shunt reactive elements; and
   a low input impedance preamplifier in parallel with the one or more protection diodes;
   wherein the lattice balun has a first impedance, wherein the at least one of the one or more shunt capacitors or the one or more shunt inductors comprises a first shunt capacitor or inductor, wherein the first shunt capacitor or inductor is electrically coupled in parallel with the two outputs of the lattice balun, and wherein the first shunt capacitor or inductor has a second impedance with a magnitude that is substantially the same as that of the first impedance.

2. The MRI RF coil element of claim 1, wherein the one or more shunt reactive elements comprises at least one variable shunt reactive element that facilitates tuning of the coil.

3. The MRI RF coil element of claim 1, wherein the one or more protection diodes comprises at least one PIN diode that facilitates active decoupling.

4. The MRI RF coil element of claim 1, further comprising a printed circuit board (PCB) that comprises the lattice balun, the one or more shunt reactive elements, and the one or more protection diodes.

5. The MRI RF coil element of claim 1, further comprising:
   a Tx mode circuit comprising two PIN diodes arranged back to back and at least one of one or more Tx mode inductors or one or more Tx mode capacitors, wherein in the Tx mode, the at least one of the one or more Tx mode inductors or the one or more Tx mode capacitors is configured to create a high impedance that isolates the low input impedance preamplifier from the coil, the lattice balun, and the one or more shunt reactive elements; and
   at least one Rx mode inductor or at least one Rx mode capacitor, wherein in the Rx mode, the at least one Rx mode inductor or the at least one Rx mode capacitor is configured to cancel a reactance of the Tx mode circuit.

6. The MRI RF coil element of claim 1, wherein the low input impedance preamplifier has two preamplifier inputs electrically coupled in parallel with the two outputs of the lattice balun and also in parallel with the first shunt capacitor or inductor.

7. The MRI RF coil element of claim 1, wherein the lattice balun comprises a first lattice balun capacitor, a second lattice balun capacitor, a first lattice balun inductor, and a second lattice balun inductor.

8. The MRI RF coil element of claim 7, wherein the two inputs of the lattice balun comprise a first input and a second input, wherein the two outputs of the lattice balun comprise a first output and a second output, wherein the first lattice balun capacitor is connected between the first input and the second output, wherein the second lattice balun capacitor is connected between the second input and the first output, wherein the first lattice balun inductor is connected between the first input and the first output, and wherein the second lattice balun inductor is connected between the second input and the second output.

9. The MRI RF coil element of claim 7, wherein the first and second lattice balun capacitors and the first and second lattice balun inductors have individual impedances, and wherein the individual impedances have magnitudes that are the same as that of the first impedance.

10. A MRI RF coil array comprising a plurality of MRI RF coil elements according to claim 1.

11. A magnetic resonance imaging (MRI) radio frequency (RF) coil element configured to operate in at least one of a transmit (Tx) mode or a receive (Rx) mode, the MRI RF coil element comprising:
    a coil comprising at least one inductor, at least one capacitor, and two connection points;
    a lattice balun comprising two inputs and two outputs, wherein the two inputs of the lattice balun are connected across the two connection points of the coil;
    one or more shunt reactive elements connected across the two outputs of the lattice balun, wherein the one or more shunt reactive elements comprises at least one of one or more shunt capacitors or one or more shunt inductors;
    one or more protection diodes in parallel with the one or more shunt reactive elements;
    a low input impedance preamplifier in parallel with the one or more protection diodes;
    a Tx mode circuit comprising two PIN diodes arranged back to back and at least one of one or more Tx mode inductors or one or more Tx mode capacitors, wherein in the Tx mode, the at least one of the one or more Tx mode inductors or the one or more Tx mode capacitors is configured to create a high impedance that isolates the low input impedance preamplifier from the coil, the lattice balun, and the one or more shunt reactive elements; and
    at least one Rx mode inductor or at least one Rx mode capacitor, wherein in the Rx mode, the at least one Rx mode inductor or the at least one Rx mode capacitor is configured to cancel a reactance of the Tx mode circuit.

12. The MRI RF coil element of claim 11, wherein the one or more shunt reactive elements comprises at least one variable shunt reactive element that facilitates tuning of the coil.

13. The MRI RF coil element of claim 11, wherein the one or more protection diodes comprises at least one PIN diode that facilitates active decoupling.

14. The MRI RF coil element of claim 11, wherein the one or more protection diodes comprise at least one pair of crossed diodes that facilitates passive decoupling.

15. The MRI RF coil element of claim 11, wherein the lattice balun comprises a first lattice balun capacitor, a second lattice balun capacitor, a first lattice balun inductor, and a second lattice balun inductor.

16. The MRI RF coil element of claim 11, further comprising a printed circuit board (PCB) that comprises the lattice balun, the one or more shunt reactive elements, the one or more protection diodes, the Tx mode circuit, and the at least one Rx mode inductor or the at least one Rx mode capacitor.

17. A MRI RF coil array comprising a plurality of MRI RF coil elements according to claim 11.

18. A magnetic resonance imaging (MRI) radio frequency (RF) coil array configured to operate in at least one of a transmit (Tx) mode or a receive (Rx) mode, the MRI RF coil array comprising:
- a plurality of coil elements, wherein each coil element of the plurality of coil elements comprises:
  - a coil of that coil element comprising at least one inductor of that coil, at least one capacitor of that coil, and two connection points of that coil;
  - a lattice balun of that coil element comprising two inputs of that lattice balun and two outputs of that lattice balun, wherein the two inputs of that lattice balun are connected across the two connection points of the coil of that coil element;
  - one or more shunt reactive elements of that coil element connected across the two outputs of the lattice balun of that coil element, wherein the one or more shunt reactive elements comprises at least one of one or more shunt capacitors of that coil element or one or more shunt inductors of that coil element;
  - one or more protection diodes of that coil element in parallel with the one or more shunt reactive elements of that coil element; and
  - a low input impedance preamplifier of that coil element in parallel with the one or more protection diodes of that coil element;
  - wherein the low input impedance preamplifier of that coil element has two preamplifier inputs electrically shorted respectively to the two outputs of the lattice balun of that coil element.

19. The MRI RF coil array of claim 18, wherein each coil element of the plurality of coil elements comprises:
- a Tx mode circuit of that coil element comprising two PIN diodes of that coil element arranged back to back and at least one of one or more Tx mode inductors of that coil element or one or more Tx mode capacitors of that coil element, wherein in the Tx mode, the at least one of the one or more Tx mode inductors of that coil element or the one or more Tx mode capacitors of that coil element is configured to create a high impedance that isolates the low input impedance preamplifier of that coil element from the coil of that coil element, the lattice balun of that coil element, and the one or more shunt reactive elements of that coil element; and
- at least one Rx mode inductor of that coil element or at least one Rx mode capacitor of that coil element, wherein in the Rx mode, the at least one Rx mode inductor of that coil element or the at least one Rx mode capacitor of that coil element is configured to cancel a reactance of the Tx mode circuit of that coil element.

20. The MRI RF coil array of claim 18, wherein the one or more shunt reactive elements of that coil element comprises a variable capacitor or inductor electrically coupled in parallel with the two preamplifier inputs of the low input impedance preamplifier of that coil element and in parallel with the two outputs of the lattice balun of that coil element, and wherein the variable capacitor or inductor of that coil element is configured to tune a resonant frequency of the coil of that coil element.

* * * * *